(12) United States Patent
Chu et al.

(10) Patent No.: US 12,733,504 B2
(45) Date of Patent: Sep. 8, 2026

(54) ELECTRONIC PACKAGE AND MANUFACTURING METHOD THEREOF

(71) Applicant: SILICONWARE PRECISION INDUSTRIES CO., LTD., Taichung City (TW)

(72) Inventors: Yen-Yu Chu, Taichung City (TW); Tsung-Yu Huang, Taichung City (TW); Kuo-Hua Tseng, Taichung City (TW); Tsung-Xin Chien, Taichung City (TW); Chang-Ku-Yuan Sie, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 649 days.

(21) Appl. No.: 18/310,629

(22) Filed: May 2, 2023

(65) Prior Publication Data

US 2024/0234335 A1 Jul. 11, 2024

(30) Foreign Application Priority Data

Jan. 5, 2023 (TW) ................................. 112100418

(51) Int. Cl.

| | |
|---|---|
| ***H10W 42/20*** | (2026.01) |
| ***H10W 40/00*** | (2026.01) |
| ***H10W 40/22*** | (2026.01) |
| ***H10W 72/00*** | (2026.01) |
| ***H10W 74/01*** | (2026.01) |
| ***H10W 90/00*** | (2026.01) |

(52) U.S. Cl.

CPC ......... *H10W 42/20* (2026.01); *H10W 40/037* (2026.01); *H10W 40/22* (2026.01); *H10W 74/014* (2026.01); *H10W 90/00* (2026.01); *H10W 90/734* (2026.01); *H10W 72/0198* (2026.01); *H10W 72/884* (2026.01); *H10W 74/016* (2026.01); *H10W 90/754* (2026.01)

(58) Field of Classification Search

None

See application file for complete search history.

(56) References Cited

U.S. PATENT DOCUMENTS

| | | | | |
|---|---|---|---|---|
| 2019/0067208 | A1* | 2/2019 | Lin | H10W 42/20 |
| 2020/0185286 | A1* | 6/2020 | Fang | H10W 40/251 |
| 2021/0193587 | A1* | 6/2021 | Yada | H01L 24/97 |
| 2024/0203902 | A1* | 6/2024 | Otsubo | H10W 42/20 |

* cited by examiner

*Primary Examiner* — Jay C Chang

(74) *Attorney, Agent, or Firm* — Dority & Manning, PA

(57) ABSTRACT

An electronic package is provided, in which an electronic component and conductors are disposed on a substrate structure, and the electronic component and the conductors are covered by an encapsulation layer. A conductive layer is formed on side surfaces of the encapsulation layer and in contact with the conductors, where the conductors are bonding wires used in a wire bonding process. Therefore, a conventional heat sink is replaced by the conductors, thereby reducing a use area of the substrate structure.

6 Claims, 10 Drawing Sheets

ELECTRONIC PACKAGE AND MANUFACTURING METHOD THEREOF

BACKGROUND

1. Technical Field

The present disclosure relates to a semiconductor packaging process, and more particularly, to an electronic package with a shielding structure and manufacturing method thereof.

2. Description of Related Art

With the vigorous development of the electronic industry, electronic products are also gradually developing toward the trend of multi-function and high performance. Technologies currently applied in the field of chip packaging include flip-chip packaging modules such as chip scale package (CSP), direct chip attached (DCA), multi-chip module (MCM), or the like.

As shown in FIG. 1, in a method of manufacturing a conventional semiconductor package 1, a semiconductor chip 11 is first disposed on a packaging substrate 10 with an active surface 11*a* of the semiconductor chip 11 by flip-chip bonding (i.e., via conductive bumps 110 and an underfill 111). Then, a heat sink 13 is bonded on an inactive surface 11*b* of the semiconductor chip 11 with a top sheet 130 of the heat sink 13 by a thermal interface material (TIM) layer 12, and supporting legs 131 of the heat sink 13 are disposed on the packaging substrate 10 via metal glue 14. Afterward, an encapsulation molding operation is performed to provide a packaging colloid (not shown) to cover the semiconductor chip 11 and the heat sink 13, and the top sheet 130 of the heat sink 13 is exposed from the packaging colloid.

In the conventional semiconductor package 1, the metal glue 14 can be bonded to ground pads (not shown) of the packaging substrate 10, such that the heat sink 13 can be used as a shielding structure to protect the semiconductor chip 11 from electromagnetic interference (EMI).

However, in the conventional semiconductor package 1, the heat sink 13 is required to be deployed to provide the heat dissipation and shielding functions for the semiconductor chip 11, so that the supporting legs 131 of the heat sink 13 will occupy an extremely large use area of the packaging substrate 10 and are not conducive to reducing the use area of the circuit board, thereby failing to achieve the purpose of integration.

Besides, the semiconductor chip 11 and the heat sink 13 are respectively placed on the single packaging substrate 10, thereby greatly increasing process time, resulting in the inability to achieve the purpose of mass production.

Therefore, how to overcome the aforementioned drawbacks of the prior art has become an urgent issue to be addressed at present.

SUMMARY

In view of the various shortcomings of the prior art, the present disclosure provides an electronic package, which comprises: a substrate structure having electrical contact pads and ground pads; an electronic component disposed on the substrate structure and electrically connected to the electrical contact pads; conductors disposed on the substrate structure and spaced apart from the electronic component, wherein the conductors are of wires and electrically connected to the ground pads; an encapsulation layer formed on the substrate structure and covering the electronic component and the conductors, wherein the encapsulation layer is defined with a first surface, a second surface opposing the first surface, and side surfaces adjacent to the first surface and the second surface, wherein the encapsulation layer is bonded onto the substrate structure by the first surface of the encapsulation layer, and the conductors are exposed from the side surfaces of the encapsulation layer; and a conductive layer formed on the encapsulation layer and in contact with the conductors.

The present disclosure also provides a method of manufacturing an electronic package, the method comprises: providing a carrier having a plurality of substrate structures arranged in an array, wherein each of the substrate structures has electrical contact pads and ground pads; disposing electronic components on the substrate structures, wherein the electronic components are electrically connected to the electrical contact pads; disposing conductive components on the carrier by wire bonding, wherein each of the conductive components is located between any two adjacent ones of the substrate structures, and the conductive components are electrically connected to the ground pads; forming an encapsulation layer on the substrate structures, wherein the electronic components and the conductive components are covered by the encapsulation layer, wherein the encapsulation layer is defined with a first surface and a second surface opposing the first surface, and the encapsulation layer is bonded onto the substrate structures by the first surface of the encapsulation layer; forming a recess on the second surface of the encapsulation layer between any two adjacent ones of the substrate structures, wherein the recess separates each of the conductive components, such that two conductors are formed from each of the conductive components; forming a conductive layer in the recess on the encapsulation layer, wherein the conductive layer is in contact with the conductors; and performing a singulation process along the recess, wherein the encapsulation layer is defined with side surfaces adjacent to the first surface and the second surface, and the conductors are in contact with the conductive layer on the side surfaces of the encapsulation layer.

The present disclosure further provides a method of manufacturing an electronic package, the method comprises: providing a carrier having a plurality of substrate structures arranged in an array, wherein a separation line is defined between adjacent ones of the substrate structures, wherein each of the substrate structures has electrical contact pads and ground pads; disposing electronic components on the substrate structures, wherein the electronic components are electrically connected to the electrical contact pads; disposing conductive components on the carrier by wire bonding, wherein each of the conductive components is located between any two adjacent ones of the substrate structures, and the conductive components are electrically connected to the ground pads; forming an encapsulation layer on the substrate structures, wherein the electronic components and the conductive components are covered by the encapsulation layer, wherein the encapsulation layer is defined with a first surface and a second surface opposing the first surface, and the encapsulation layer is bonded onto the substrate structures by the first surface of the encapsulation layer; forming a recess on the second surface of the encapsulation layer between any two adjacent ones of the substrate structures, wherein the recess separates each of the conductive components, such that two conductors are formed from each of the conductive components; performing a singulation process along the recess, wherein the encapsulation layer is defined with side surfaces adjacent to the first surface and the second surface, and the conductors are exposed from the side surfaces of the encapsulation layer; and forming a conductive layer on the side surfaces of the encapsulation layer, wherein the conductive layer is in contact with the conductors.

The present disclosure also provides a method of manufacturing an electronic package, the method comprises: providing a substrate structure having electrical contact pads and ground pads; disposing an electronic component on the substrate structure, wherein the electronic component is electrically connected to the electrical contact pads; disposing conductors on the substrate structure by wire bonding, wherein the conductors are electrically connected to the ground pads; carrying the substrate structure and the electronic component and the conductors on the substrate structure by a bearer; forming an encapsulation layer on the substrate structure, wherein the electronic component and the conductors are covered by the encapsulation layer, wherein the encapsulation layer is defined with a first surface, a second surface opposing the first surface, and side surfaces adjacent to the first surface and the second surface, wherein the encapsulation layer is bonded onto the substrate structure by the first surface of the encapsulation layer, and the conductors are exposed from the side surfaces of the encapsulation layer; removing the bearer after forming the encapsulation layer; and forming a conductive layer on the side surfaces of the encapsulation layer, wherein the conductive layer is in contact with the conductors.

In the aforementioned electronic package and three methods, the recess is free from penetrating through the encapsulation layer, such that the side surfaces of the encapsulation layer are step-shaped.

In the aforementioned electronic package and three methods, the recess penetrates through the encapsulation layer and is free from penetrating through the substrate structures, such that side surfaces of the substrate structures protrude with respect to the side surfaces of the encapsulation layer.

In the aforementioned electronic package and three methods, the recess penetrates through the encapsulation layer and the substrate structures, such that the side surfaces of the encapsulation layer are flush with side surfaces of the substrate structures.

In the aforementioned electronic package and three methods, the conductive layer is flush with sides surfaces of the substrate structures.

In the aforementioned electronic package and three methods, the conductive layer is formed on a portion of each of the side surfaces of the encapsulation layer or the entire side surfaces of the encapsulation layer.

In the aforementioned electronic package and three methods, the conductive layer is formed on the entire side surfaces of the encapsulation layer and extends onto side surfaces of the substrate structures. For instance, the conductive layer is formed on a portion of each of the side surfaces of the substrate structures or the entire side surfaces of the substrate structures.

In the aforementioned electronic package and three methods, the present disclosure further comprises forming a heat dissipation structure on the second surface of the encapsulation layer, wherein the heat dissipation structure is covered by the conductive layer.

In the aforementioned electronic package and three methods, the electronic component is an active element, a passive element, or a combination of the active element and the passive element.

As can be seen from the above, in the electronic package of the present disclosure and manufacturing method thereof, the conventional heat sink is replaced by the conductor, and the width of the conductor is much less than the width of the supporting leg of the conventional heat sink. Hence, compared with the prior art, the use area of the substrate structure can be reduced so as to accommodate other functional components when the electronic component and the conductor are disposed on the substrate structure, thereby achieving the purpose of integration and making the electronic products to meet the miniaturization requirements.

In addition, the carrier is used in the manufacturing method of the present disclosure, so that a plurality of packaging modules are formed on the single carrier, and then a plurality of the electronic packages are obtained by a singulation process, such that the process time can be greatly reduced, thereby achieving the purpose of mass production.

BRIEF DESCRIPTION OF THE DRAWINGS

FIG. 2A-1, FIG. 2B-1, FIG. 2C-1 and FIG. 2D-1 are schematic cross-sectional views illustrating a method of manufacturing an electronic package according to the present disclosure.

FIG. 2A-2 is a schematic partial top view of FIG. 2A-1.

FIG. 2A-3 is a schematic partial top view showing another aspect of FIG. 2A-2.

FIG. 2B-2 and FIG. 2B-3 are schematic cross-sectional views showing other different aspects of FIG. 2B-1.

FIG. 2C-2 and FIG. 2C-3 are schematic cross-sectional views showing another way of FIG. 2C-1.

FIG. 2D-2 and FIG. 2D-3 are schematic cross-sectional views showing other different aspects of FIG. 2D-1.

DETAILED DESCRIPTION

Figure 1:
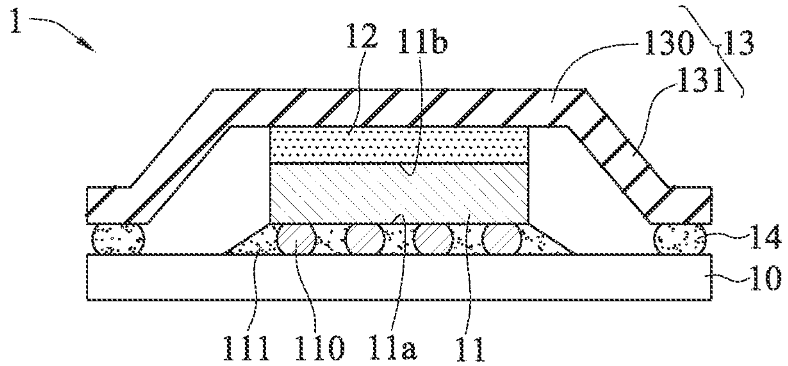
FIG. 1 is a schematic cross-sectional view of a conventional semiconductor package.

The following describes the implementation of the present disclosure with examples. Those familiar with the art can easily understand the other advantages and effects of the present disclosure from the content disclosed in this specification.

It should be noted that the structures, ratios, sizes, etc. shown in the drawings appended to this specification are to be construed in conjunction with the disclosure of this specification in order to facilitate understanding of those skilled in the art. They are not meant to limit the implementations of the present disclosure, and therefore have no substantial technical meaning. Any modifications of the structures, changes of the ratio relationships, or adjustments of the sizes, are to be construed as falling within the range covered by the technical content disclosed herein to the extent of not causing changes in the technical effects created and the objectives achieved by the present disclosure. Meanwhile, terms such as "on," "a," "one," and the like recited herein are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

FIG. 2A-1, FIG. 2B-1, FIG. 2C-1 and FIG. 2D-1 are schematic cross-sectional views illustrating a method of manufacturing an electronic package 2 according to the present disclosure.

Figures 1, 2A:
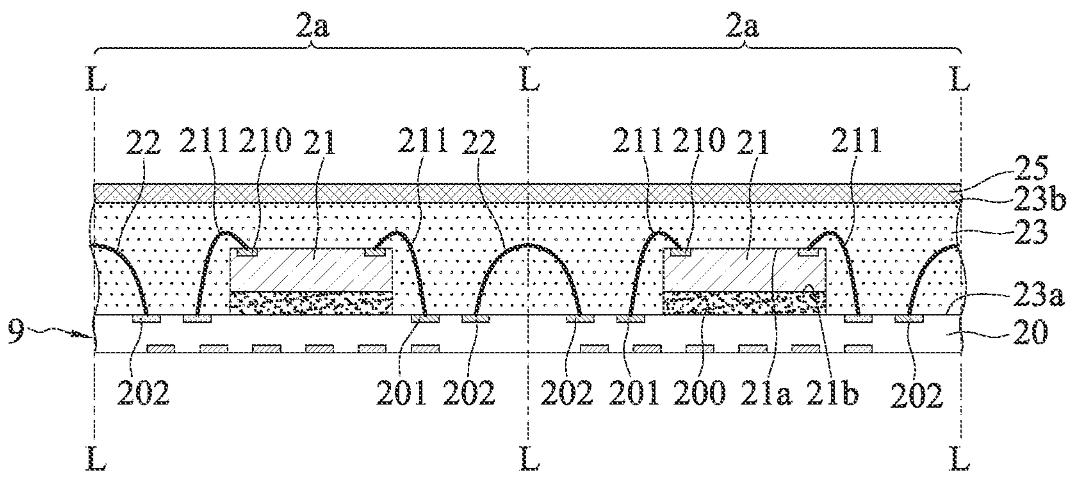

As shown in FIG. 2A-1, a plurality of electronic components 21 are disposed on a carrier 9 including a plurality of substrate structures 20, and a plurality of conductive components 22 are formed on the carrier 9 and disposed between adjacent ones of the substrate structures 20. Then, an encapsulation layer 23 is formed on the carrier 9, so that the plurality of electronic components 21 and the plurality of conductive components 22 are covered by the encapsulation layer 23.

Figures 2, 2A:
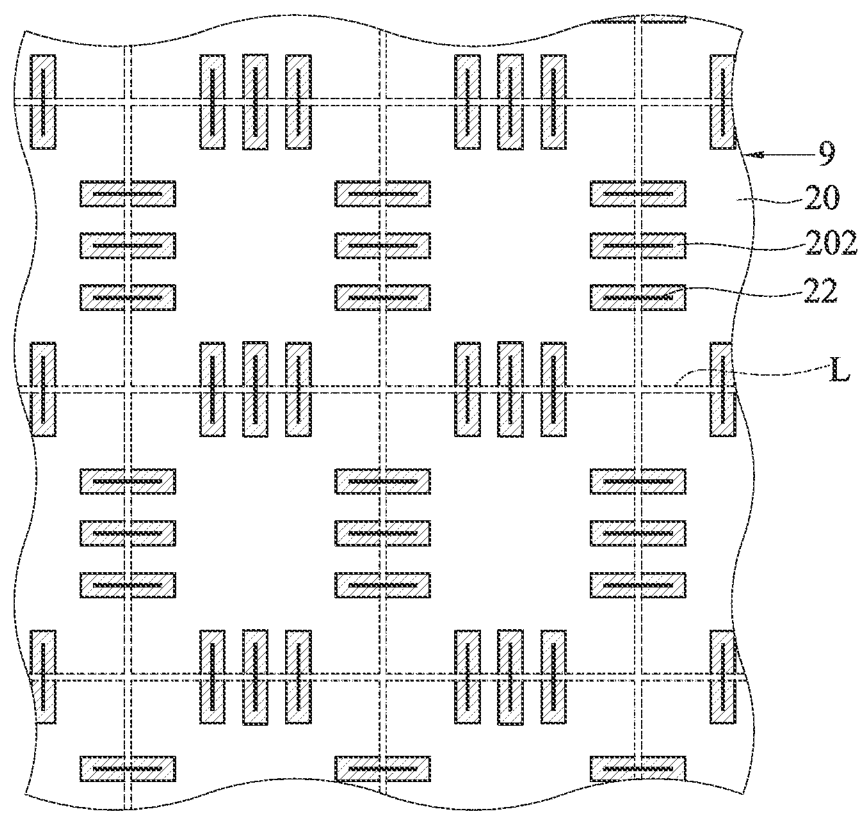

The carrier 9 is of a strip form or a full-panel specification, so that the plurality of substrate structures 20 are arranged in an array, as shown in FIG. 2A-2, such that a separation line L (e.g., a separation boundary line) is defined between adjacent ones of the substrate structures 20.

Figure 5:
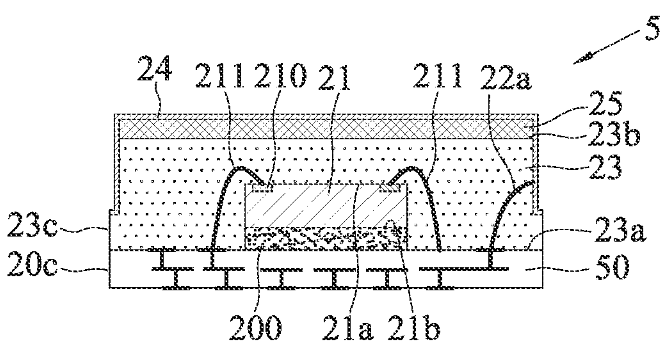
FIG. 5, FIG. 6 and FIG. 7 are schematic cross-sectional views showing other embodiments of FIG. 2D-1.

In an embodiment, the substrate structure 20 is, for example, a packaging substrate with a core layer and a circuit structure, or a packaging substrate with a coreless circuit structure. The substrate structure 20 has a plurality of circuit layers, such that the circuit layer has a plurality of electrical contact pads 201 and a plurality of ground pads 202 on one side of the carrier 9. For instance, in an electronic package as shown in FIG. 5, a substrate structure 50 can be a packaging substrate with coreless circuit structure and has fan-out redistribution layer (RDL). It can be understood that the substrate structures 20 can also be other carrier structures (e.g., silicon interposers, lead frames, or the like) for carrying electronic components such as chips, but the present disclosure is not limited to as such.

Figures 2, 2A, 3:
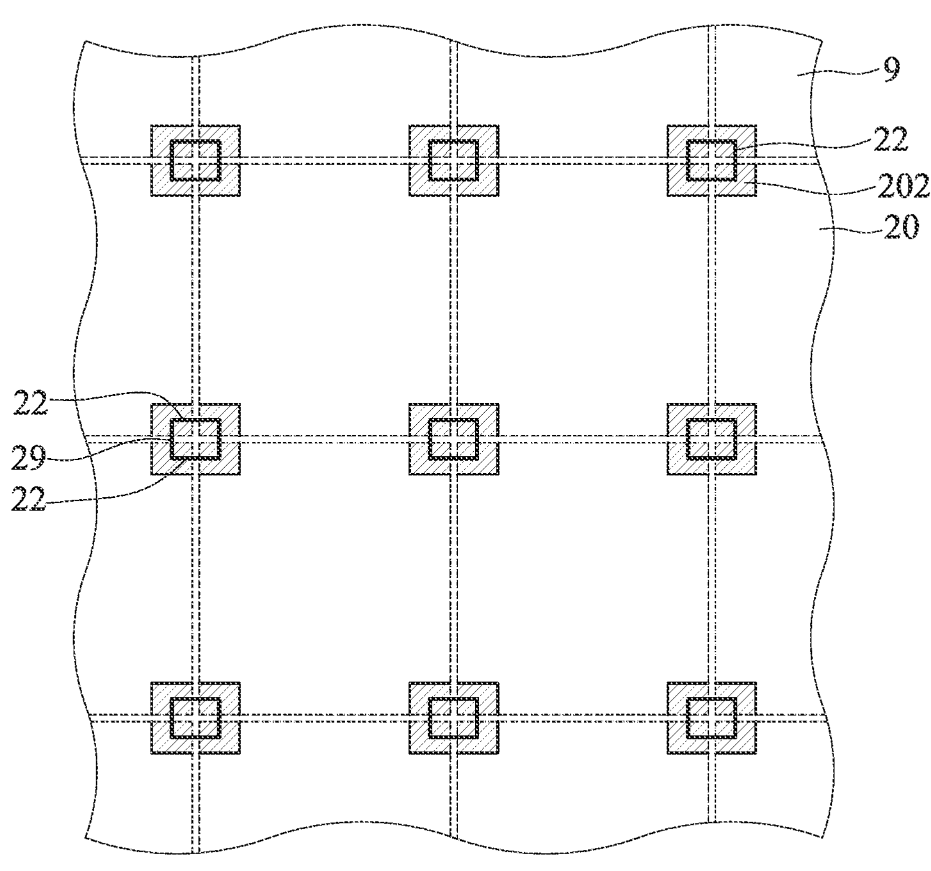

Furthermore, the ground pads 202 can be arranged on the substrate structures 20 according to requirements, such as an edge area as shown in FIG. 2A-2 or a corner area as shown in FIG. 2A-3, but the present disclosure is not limited to as such.

The electronic component 21 is an active element, a passive element, or a combination of the active element and the passive element, wherein the active element is for example a semiconductor chip, and the passive element is for example a resistor, a capacitor, or an inductor.

In an embodiment, the electronic component 21 is a semiconductor chip and has an active surface 21*a* and an inactive surface 21*b* opposing the active surface 21*a*, and a plurality of electrode pads 210 are formed on the active surface 21*a*. Further, the electronic component 21 is bonded onto the substrate structure 20 with the inactive surface 21*b* via a bonding layer 200, and the electrode pads 210 on the active surface 21*a* are electrically connected to the electrical contact pads 201 by wires 211 such as bonding wires via wire bonding.

Figure 6:
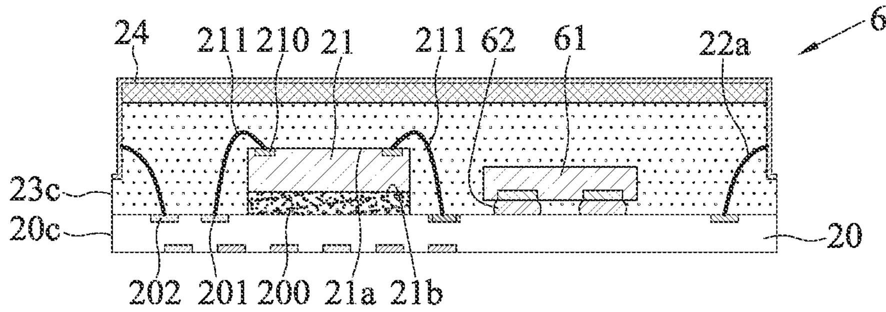

Moreover, in other embodiments, in an electronic package 6 as shown in FIG. 6, an electronic component 61 is disposed on electrical contact pads of the substrate structure 20 with electrode pads of an active surface of the electronic component 61 via a plurality of conductive bumps 62 such as solder material, metal pillars, or other structures in a flip-chip manner, and an underfill (not shown) can be formed between the substrate structure 20 and the active surface to cover each of the conductive bumps 62 according to requirements.

It can be understood that there are many ways to electrically connect the electronic component 21 to the substrate structure 20, and the required type and quantity of the electronic component that can be disposed on the substrate structure 20 are not limited to the above.

Additionally, at least one electronic component 21 can be disposed on the single substrate structure 20 according to requirements, such as one electronic component 21 as shown in FIG. 2A-1 or the plurality of electronic components 21, 61 as shown in FIG. 6.

The conductive components 22 are bonding wires for a wire-bonding process and have a structure similar to that of the wires 211, and the conductive components 22 are arranged on the substrate structures 20 and spaced apart from the electronic components 21, such that the conductive components 22 are in contact with and bonded onto the ground pads 202 of the substrate structures 20, so that the conductive components 22 are electrically connected to the substrate structures 20.

In an embodiment, opposing ends of the plurality of conductive components 22 are bonded onto the ground pads 202 of two adjacent ones of the substrate structures 20 of the carrier 9 respectively, as shown in FIG. 2A-2.

Moreover, based on the arrangement of the ground pads 202, the conductive component 22 can be arranged across side areas of two adjacent ones of the substrate structures 20, as shown in FIG. 2A-2; alternatively, the conductive component 22 can also be arranged across corner areas of two adjacent ones of the substrate structures 20, as shown in FIG. 2A-3.

Furthermore, when the conductive component 22 is arranged across corner areas of two adjacent ones of the substrate structures 20, a bonding wire for wire bonding can be used as a connector 29, such that opposing two ends of the connector 29 are connected to the conductive components 22 on the two substrate structures 20 respectively, as shown in FIG. 2A-3, and the connector 29 is also connected to the ground pads 202 of two adjacent ones of the substrate structures 20.

The encapsulation layer 23 is defined with a first surface 23*a* and a second surface 23*b* opposing the first surface 23*a*, wherein the encapsulation layer 23 is bonded onto each of the substrate structures 20 with the first surface 23*a* of the encapsulation layer 23 to form a packaging module 2*a* including the substrate structure 20, the electronic component 21 and the encapsulation layer 23.

In an embodiment, the encapsulation layer 23 is made of an insulating material such as polyimide (PI), dry film, packaging colloid of epoxy resin, or molding compound. For instance, the encapsulation layer 23 can be formed on the substrate structures 20 by liquid compound, injection, lamination, compression molding, or the like.

Additionally, a heat dissipation structure 25 such as an adhesive metal sheet or a plated metal layer can be formed on the second surface 23*b* of the encapsulation layer 23 of each of the packaging modules 2*a* according to requirements.

Figures 1, 2B:
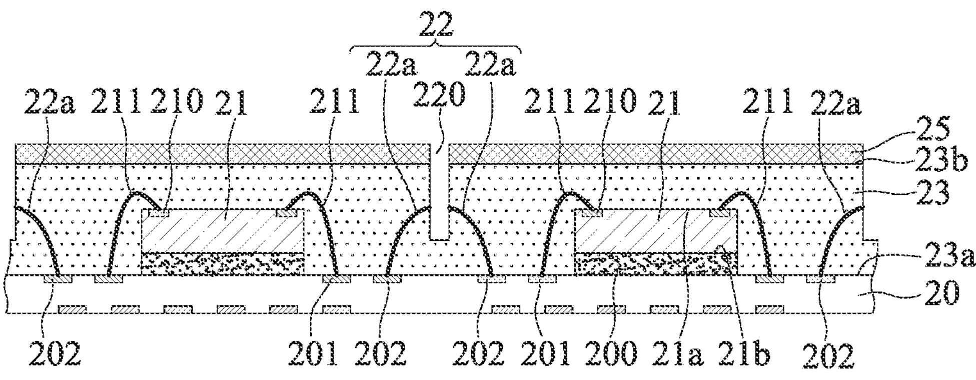
Figures 2, 2B:
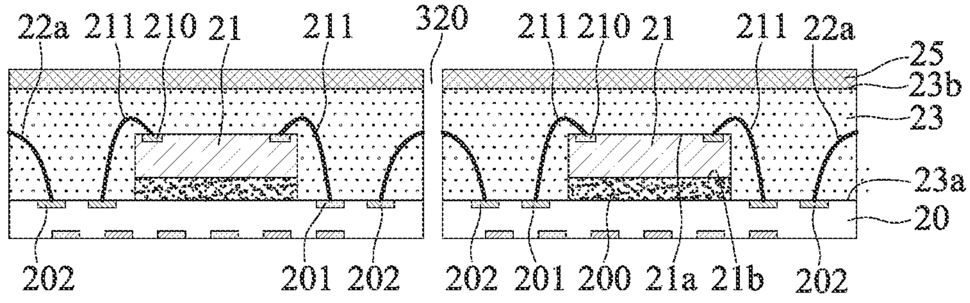
Figures 2, 2B, 3:
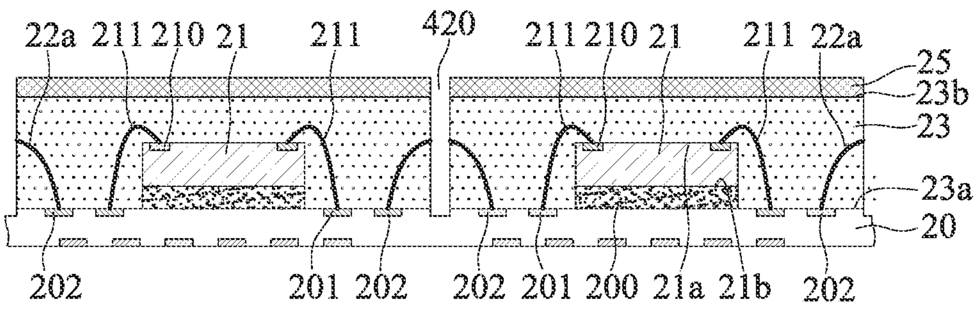

As shown in FIG. 2B-1, a recess 220 is formed on the separation line L between two adjacent ones of the packaging modules 2*a*, such that the recess 220 penetrates through the heat dissipation structure 25 and extends into the encapsulation layer 23, so that each of the conductive components 22 is separated into two conductors 22*a*.

In an embodiment, the conductors 22*a* are exposed from sidewall surfaces of the recess 220.

Moreover, the depth of the recess 220 can be designed according to requirements. For instance, the recess can penetrate through the encapsulation layer 23 and extend to the substrate structures 20, such as a recess 320 penetrating through the substrate structures 20 (or the packaging modules 2*a*) as shown in FIG. 2B-2, or a recess 420 free from penetrating through the substrate structures 20 as shown in FIG. 2B-3.

Figures 1, 2C:
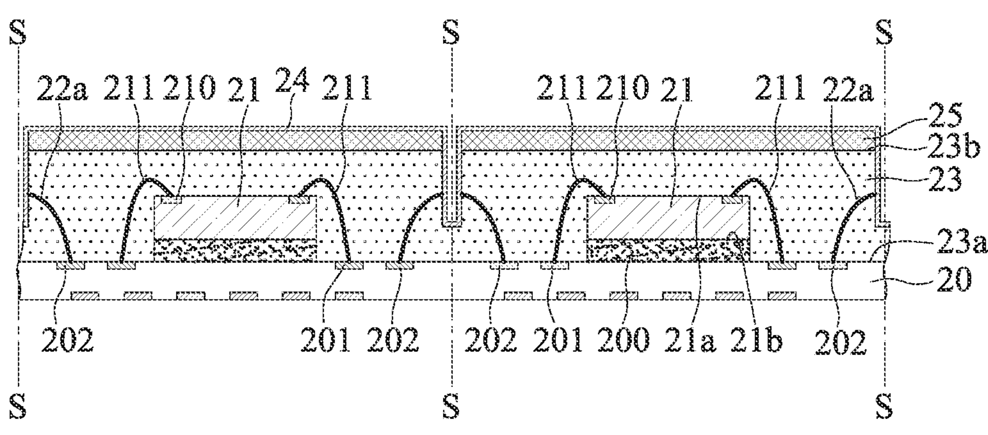
Figures 2, 2C:
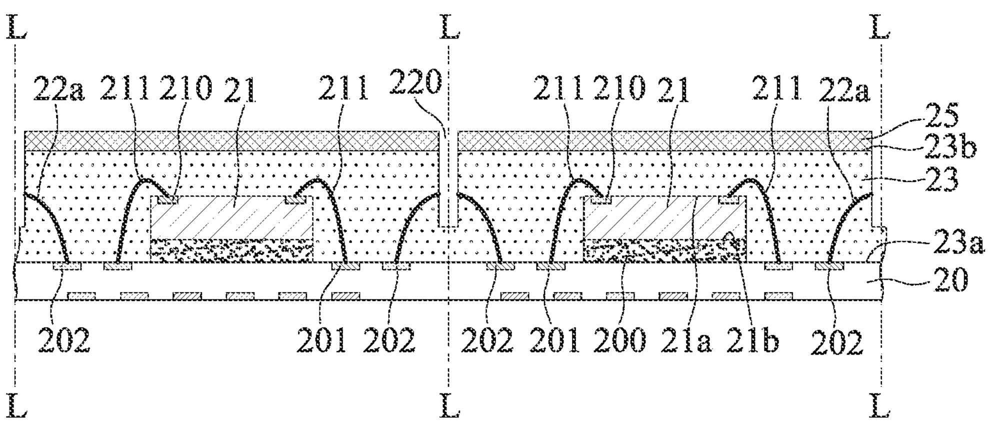
Figures 2, 2C, 3:
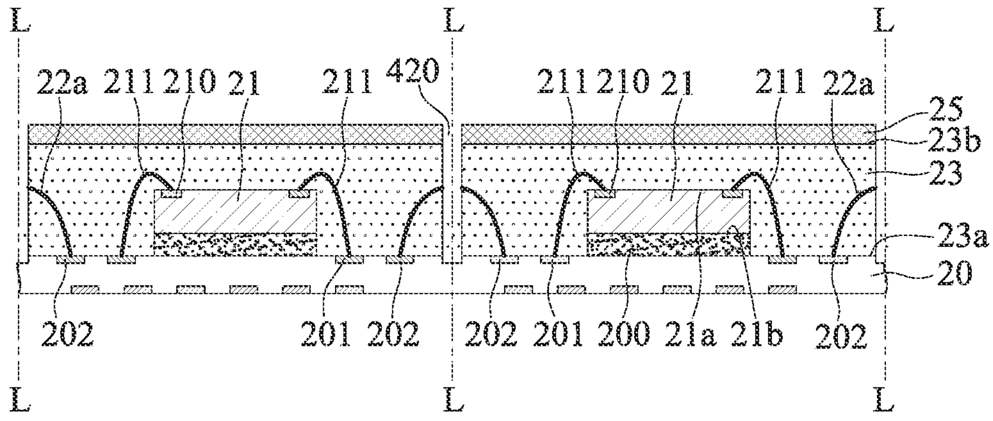

As shown in FIG. 2C-1, subsequent to a manufacturing process shown in FIG. 2B-1, a conductive layer 24 is formed on the surfaces of the packaging modules 2*a* and the sidewall surfaces of the recess 220, so that the conductive layer 24 is in contact with the conductors 22*a* for shielding.

In an embodiment, the conductive layer 24 is a metal layer and is made from for example gold (Au), silver (Ag), copper (Cu), nickel (Ni), iron (Fe), aluminum (Al), stainless steel (SUS), or the like, but the present disclosure is not limited to as such. For instance, the conductive layer 24 can be formed by means of electroplating, coating, sputtering, chemical plating, electroless plating, or evaporation.

Furthermore, the recess 220 is free from being filled up by the conductive layer 24, so that the separation line L between two adjacent ones of the packaging modules 2*a* is still concave.

Figures 1, 2D:
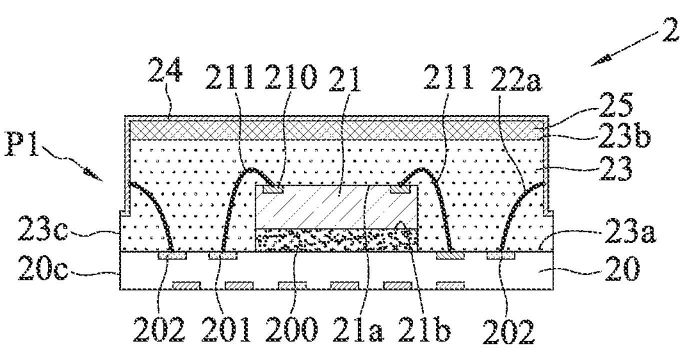
Figures 2, 2D:
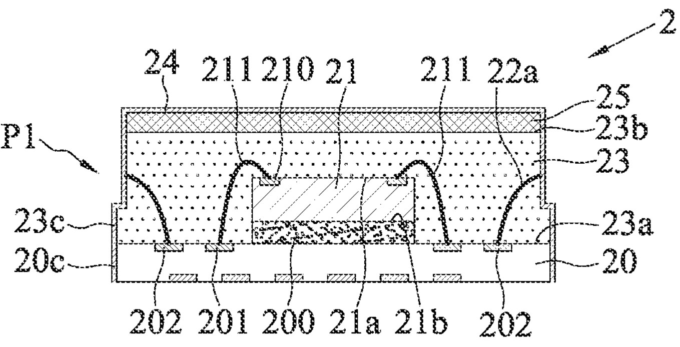
Figures 2, 2D, 3:
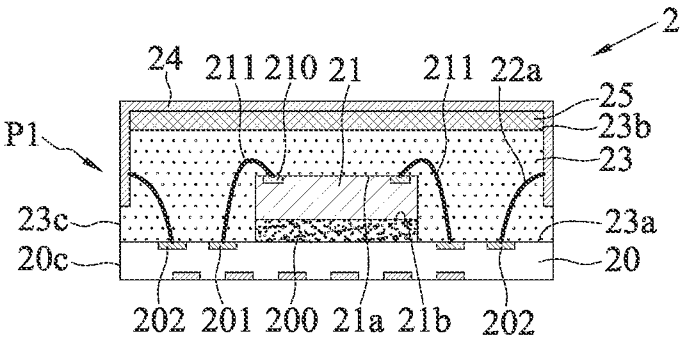

As shown in FIG. 2D-1, a singulation process is performed along a cutting path S shown in FIG. 2C-1 at each of the separation lines L to obtain a plurality of the electronic packages 2.

In an embodiment, based on the design of the recess 220 shown in FIG. 2B-1, side surfaces 23*c* of the encapsulation layer 23 are step-shaped. For instance, in the packaging module 2*a*, a notch P1 (or a recess) is formed on a portion of each of the side surfaces 23*c* of the encapsulation layer 23 adjacent to the second surface 23*b*, such that the conductive layer 24 is formed on the notches P1 (or the recesses), so that side surfaces 20*c* of the substrate structure 20 and a portion of each of the side surfaces 23*c* of the encapsulation layer 23 adjacent to the first surface 23*a* are exposed, i.e., the side surfaces 20*c* of the substrate structure 20 and a portion of each of the side surfaces 23*c* of the encapsulation layer 23 are not covered by the conductive layer 24.

Furthermore, the conductive layer 24 can also cover the side surfaces 20*c* of the substrate structure 20 and a portion of each of the side surfaces 23*c* of the encapsulation layer 23 adjacent to the first surface 23*a*, as shown in FIG. 2D-2. For instance, a singulation process can be performed along each of the separation lines L first, as shown in FIG. 2C-2, and then the conductive layer 24 is formed on the heat dissipation structure 25, the side surfaces 20*c* of the substrate structure 20, and the side surfaces 23*c* of the encapsulation layer 23.

It can be understood that if the manufacturing process shown in FIG. 2C-2 is continued, the conductive layer 24 can also only be formed on the heat dissipation structure 25 and a portion of each of the side surfaces 23*c* of the encapsulation layer 23 adjacent to the second surface 23*b*, as shown in FIG. 2D-3, so that the side surfaces 20*c* of the substrate structure 20 and a portion of each of the side surfaces 23*c* of the encapsulation layer 23 adjacent to the first surface 23*a* are exposed, and the conductive layer 24 is flush with the side surfaces 20*c* of the substrate structure 20 and the exposed side surfaces 23*c* of the encapsulation layer 23.

Figure 3A:
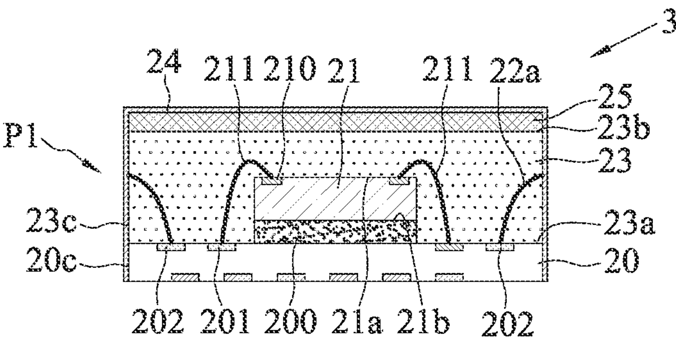
FIG. 3A is a schematic cross-sectional view showing a subsequent process of FIG. 2B-2.
Figure 3B:
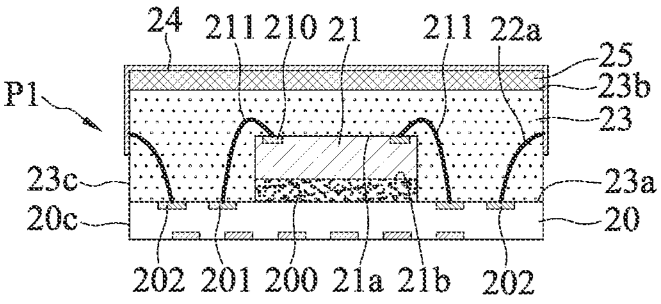
FIG. 3B and FIG. 3C are schematic cross-sectional views showing other different aspects of FIG. 3A.
Figure 3C:
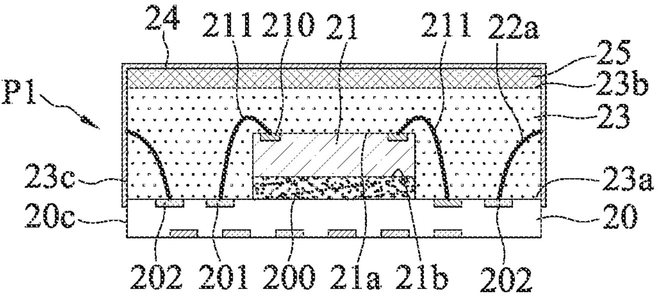

In addition, if the manufacturing process shown in FIG. 2B-2 is continued, that is, the recess 320 penetrates through the encapsulation layer 23 and the substrate structures 20, an electronic package 3 shown in FIG. 3A can be obtained, and the entire side surfaces 20*c* of the substrate structure 20 are flush with (or coplanar with) the entire side surfaces 23*c* of the encapsulation layer 23, so that the conductive layer 24 can be formed on the entire side surfaces 20*c* of the substrate structure 20 and the entire side surfaces 23*c* of the encapsulation layer 23. It can be understood that the conductive layer 24 can extend and be formed on a portion of each of the side surfaces 23*c* of the encapsulation layer 23 (as shown in FIG. 3B) or a portion of each of the side surfaces 20*c* of the substrate structure 20 (as shown in FIG. 3C) according to requirements.

Figure 4A:
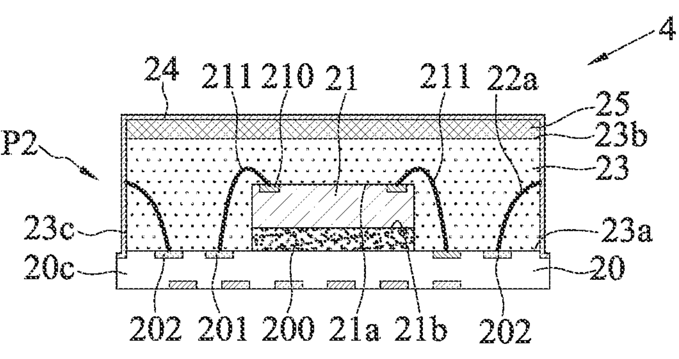
FIG. 4A is a schematic cross-sectional view showing a subsequent process of FIG. 2B-3.
Figure 4B:
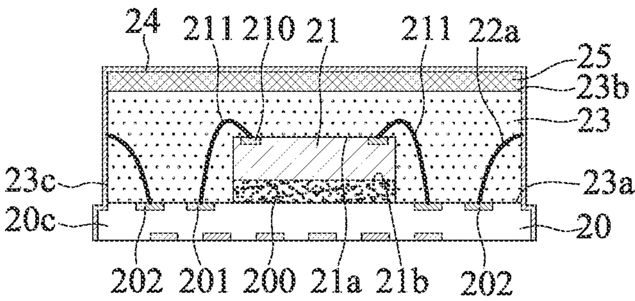
FIG. 4B and FIG. 4C are schematic cross-sectional views showing other different aspects of FIG. 4A.
Figure 4C:
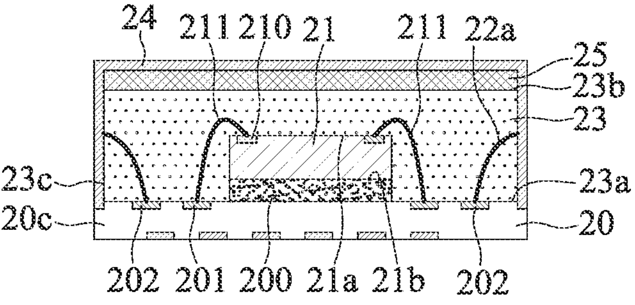

Moreover, if the manufacturing process shown in FIG. 2B-3 is continued, that is, the recess 420 penetrates through the encapsulation layer 23 and free from penetrating through the substrate structures 20, an electronic package 4 shown in FIG. 4A can be obtained. In the electronic package 4, a notch P2 (or a recess) is formed on each of the entire side surfaces 23*c* of the encapsulation layer 23 and a portion of each of the side surfaces 20*c* of the substrate structure 20, such that the conductive layer 24 is formed on the notches P2 (or the recesses), and portions of the side surfaces 20*c* of the substrate structure 20 are exposed from the conductive layer 24. It can be understood that the conductive layer 24 can cover the entire side surfaces 20*c* of the substrate structure 20 (as shown in FIG. 4B); alternatively, the conductive layer 24 can also be flush with the exposed side surfaces 20*c* of the substrate structure 20 (as shown in FIG. 4C) according to requirements.

Therefore, in the manufacturing method of the present disclosure, the conductor 22*a* and the conductive layer 24 are in contact with each other to serve as a shielding structure to replace the conventional heat sink, so that the electronic component 21 can be protected from electromagnetic interference (EMI). Hence, compared with the prior art, the width of the wire of the conductor 22*a* of the present disclosure is much less than the width of the supporting leg of the conventional heat sink, so that the use area of the substrate structure 20 can be reduced so as to arrange other functional components when the electronic component 21 and the conductor 22*a* are disposed on the substrate structure 20, thereby achieving the purpose of integration and making the electronic products to meet the miniaturization requirements.

Figure 7:
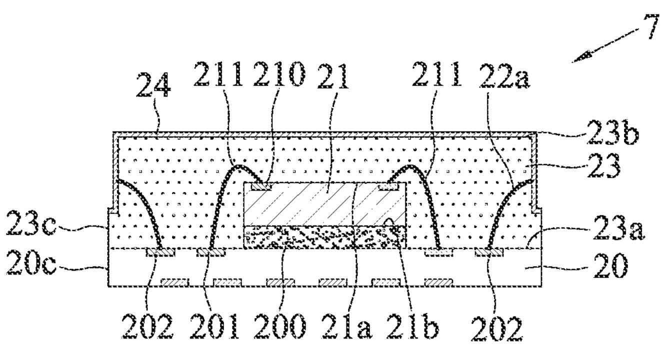

Furthermore, the conductive layer 24 can generate heat dissipation and shielding effects to the electronic component 21. Therefore, as shown in FIG. 7, an electronic package 7 is free from using the heat dissipation structure 25.

In addition, in the manufacturing method of the present disclosure, the carrier 9 comprises a plurality of substrate structures 20, so that the plurality of packaging modules 2*a* are formed on the single carrier 9, and then a plurality of the electronic packages 2, 3, 4, 5, 6, 7 are obtained by a singulation process, such that the process time can be greatly reduced, thereby achieving the purpose of mass production.

Figure 8A:
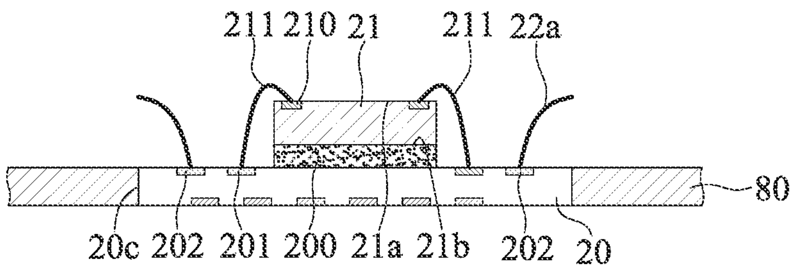
FIG. 8A, FIG. 8B and FIG. 8C are schematic cross-sectional views illustrating a method of manufacturing the electronic package according to another embodiment of the present disclosure.
Figure 8B:
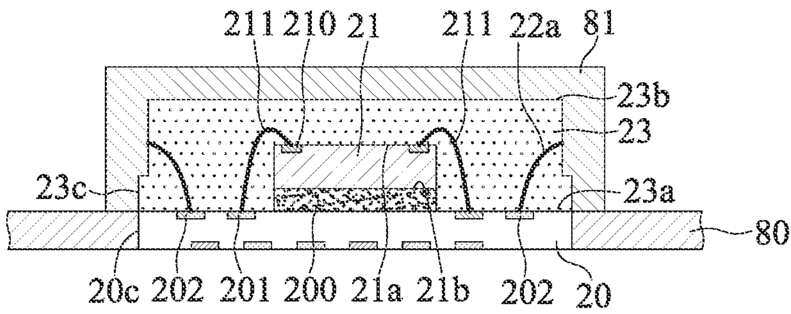
Figure 8C:
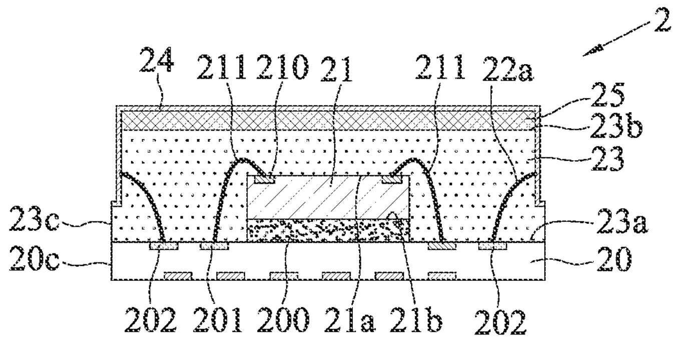

Moreover, the manufacturing methods of the electronic packages 2, 3, 4, 5, 6, 7 can also be performed on the single substrate structure 20, as shown in FIG. 8A to FIG. 8C (taking the electronic package 2 shown in FIG. 2D-1 for example), but the present disclosure is not limited to the manufacturing methods for using the carrier 9. For instance, as shown in FIG. 8A, the substrate structure 20 and the arrangements/elements thereon (such as the electronic component 21 and the conductors 22*a*) are carried by a bearer 80 (e.g., a carrier), and as shown in FIG. 8B, the bearer 80 is covered by a mold 81 to form the encapsulation layer 23, and then the bearer 80 and the mold 81 are removed, and the heat dissipation structure 25 and the conductive layer 24 are formed on the encapsulation layer 23 to obtain the electronic package 2, as shown in FIG. 8C.

The present disclosure also provides an electronic package 2, 3, 4, 5, 6, 7, comprising: a substrate structure 20, 50, at least one electronic component 21, 61, at least one conductor 22*a*, an encapsulation layer 23, and a conductive layer 24.

The substrate structure 20, 50 has a plurality of electrical contact pads 201 and at least one ground pad 202.

The electronic component 21, 61 is disposed on the substrate structure 20, 50 and electrically connected to the electrical contact pads 201.

The conductor 22*a* is of a wire. The conductor 22*a* is disposed on the substrate structure 20, 50 and spaced apart from the electronic component 21, 61, and the conductor 22*a* is electrically connected to the ground pad 202.

The encapsulation layer 23 is formed on the substrate structure 20, 50 to cover the electronic component 21, 61 and the conductor 22*a,* wherein the encapsulation layer 23 is defined with a first surface 23*a*, a second surface 23*b* opposing the first surface 23*a,* and side surfaces 23*c* adjacent to the first surface 23*a* and the second surface 23*b,* wherein the encapsulation layer 23 is bonded onto the substrate structure 20, 50 by the first surface 23*a* of the encapsulation layer 23, such that the conductor 22*a* is exposed from the side surface 23*c* of the encapsulation layer 23.

The conductive layer 24 is formed on the side surfaces 23*c* of the encapsulation layer 23 and in contact with the conductor 22*a*.

In an embodiment, the side surfaces 23*c* of the encapsulation layer 23 are step-shaped.

In an embodiment, side surfaces 20*c* of the substrate structure 20 protrude with respect to the side surfaces 23*c* of the encapsulation layer 23.

In an embodiment, the side surfaces 23*c* of the encapsulation layer 23 are flush with the side surfaces 20*c* of the substrate structure 20.

In an embodiment, the conductive layer 24 is flush with the sides surfaces 20*c* of the substrate structure 20.

In an embodiment, the conductive layer 24 is formed on a portion of each of the side surfaces 23*c* of the encapsulation layer 23 or the entire side surfaces 23*c* of the encapsulation layer 23.

In an embodiment, the conductive layer 24 is formed on the entire side surfaces 23*c* of the encapsulation layer 23 and extends onto the side surfaces 20*c* of the substrate structure 20. For instance, the conductive layer 24 is formed on a portion of each of the side surfaces 20*c* of the substrate structure 20 or the entire side surfaces 20*c* of the substrate structure 20.

In an embodiment, a heat dissipation structure 25 is disposed on the second surface 23*b* of the encapsulation layer 23, so that the heat dissipation structure 25 is covered by the conductive layer 24.

In an embodiment, the electronic component 21, 61 is an active element, a passive element, or a combination of the active element and the passive element.

To sum up, in the electronic package of the present disclosure and manufacturing method thereof, the conventional heat sink is replaced by the conductor, and the width of the conductor is much less than the width of the supporting leg of the conventional heat sink. Therefore, the use area of the substrate structure can be reduced so as to accommodate other functional components when the electronic component and the conductor are disposed on the substrate structure, thereby achieving the purpose of integration and making the electronic products to meet the miniaturization requirements.

Additionally, the carrier is used in the manufacturing method of the present disclosure, so that a plurality of packaging modules are formed on the single carrier, and then a plurality of the electronic packages are obtained by a singulation process, such that the process time can be greatly reduced, thereby achieving the purpose of mass production.

The above embodiments are set forth to illustrate the principles of the present disclosure and the effects thereof, and should not be interpreted as to limit the present disclosure. The above embodiments can be modified by one of ordinary skill in the art without departing from the scope of the present disclosure as defined in the appended claims. Therefore, the scope of protection of the right of the present disclosure should be listed as the following appended claims.

What is claimed is:

1. An electronic package, comprising:

a substrate structure having electrical contact pads and ground pads;

an electronic component disposed on the substrate structure and electrically connected to the electrical contact pads;

conductors disposed on the substrate structure and spaced apart from the electronic component, wherein the conductors are of wires and electrically connected to the ground pads;

an encapsulation layer formed on the substrate structure and covering the electronic component and the conductors, wherein the encapsulation layer is defined with a first surface, a second surface opposing the first surface, and side surfaces adjacent to the first surface and the second surface, the encapsulation layer is bonded onto the substrate structure by the first surface of the encapsulation layer, and the conductors are exposed from the side surfaces of the encapsulation layer; and a conductive layer formed on the encapsulation layer and in contact with the conductors, wherein the side surfaces of the encapsulation layer comprise step-shaped side surfaces, and the conductive layer is formed on the step-shaped side surfaces of the encapsulation layer and extends onto side surfaces of the substrate structure.

2. The electronic package of claim 1, wherein the side surfaces of the encapsulation layer are flush with side surfaces of the substrate structure.

3. The electronic package of claim 1, wherein the conductive layer is formed on a portion of each of the side surfaces of the encapsulation layer or the entire side surfaces of the encapsulation layer.

4. The electronic package of claim 1, wherein the conductive layer is formed on a portion of each of the side surfaces of the substrate structure or the entire side surfaces of the substrate structure.

5. The electronic package of claim 1, further comprising a heat dissipation structure formed on the second surface of the encapsulation layer, wherein the heat dissipation structure is covered by the conductive layer.

6. The electronic package of claim 1, wherein the electronic component is an active element, a passive element, or a combination of the active element and the passive element.

* * * * *